(12) United States Patent
Müller et al.

(10) Patent No.: US 6,855,612 B2
(45) Date of Patent: Feb. 15, 2005

(54) METHOD FOR FABRICATING A BIPOLAR TRANSISTOR

(75) Inventors: Karl-Heinz Müller, Velden (DE); Konrad Wolf, Otterfing (DE)

(73) Assignee: Infineon Technologies AG, Münich (DE)

( * ) Notice: Subject to any disclaimer, the term of this patent is extended or adjusted under 35 U.S.C. 154(b) by 0 days.

(21) Appl. No.: 10/275,423

(22) PCT Filed: May 4, 2001

(86) PCT No.: PCT/EP01/05036

§ 371 (c)(1),
(2), (4) Date: Mar. 20, 2003

(87) PCT Pub. No.: WO01/86711

PCT Pub. Date: Nov. 15, 2001

(65) Prior Publication Data

US 2003/0162350 A1 Aug. 28, 2003

(30) Foreign Application Priority Data

May 5, 2000 (EP) ............................................. 00109644

(51) Int. Cl.⁷ ........................................... H01L 21/331
(52) U.S. Cl. ..................................... 438/309; 438/360
(58) Field of Search ................................ 438/309, 331, 438/341, 343, 359, 353, 360, FOR 165, FOR 186, 202, 204, 214, 226, 234, 235, 338, 339, 340; 257/565, 571, E27.055, E27.074, 552, E31.069, E27.015, E21.074, 43, 197, 200, 273, 378, 423, 511, 517, 525, 542, 575, E27.019, E27.174, 27.197

(56) References Cited

U.S. PATENT DOCUMENTS 4,851,362 A * 7/1989 Suzuki ....................... 438/348
4,892,837 A * 1/1990 Kudo ......................... 438/365
4,904,612 A * 2/1990 Zwicknagl et al. .......... 438/320
5,001,533 A * 3/1991 Yamaguchi .................. 257/515
5,008,207 A * 4/1991 Blouse et al. ............... 438/312
5,101,256 A * 3/1992 Harame et al. .............. 257/565
5,342,797 A * 8/1994 Sapp et al. .................. 438/268
5,402,002 A * 3/1995 Meister et al. .............. 257/586
5,414,288 A * 5/1995 Fitch et al. .................. 257/328
5,422,303 A * 6/1995 Klose et al. ................. 438/359
5,432,120 A    7/1995 Meister et al.
5,627,395 A * 5/1997 Witek et al. ................. 257/350
5,773,350 A    6/1998 Herbert et al.
5,962,879 A   10/1999 Ryum et al.

FOREIGN PATENT DOCUMENTS

EP    0 418 185    3/1991
EP    0 600 276    5/1996
EP    0 724 298   11/1996

OTHER PUBLICATIONS

Abstract of Japanese 07086301, Published Mar. 31, 1995, Patent Abstracts of Japan, vol. 1995, No. 06, Jul. 31, 1995.
Gregory et al, "Fully Self–Aligned Si Bipolar Transistors with Collector and Base Grown Using Silane–Only Selective Epitaxy", *Electronic Letters*, vol. 32, No. 9, Apr. 25, 1996, pp. 850–851.

* cited by examiner

*Primary Examiner*—George Fourson
*Assistant Examiner*—Brook Kebede
(74) *Attorney, Agent, or Firm*—Schiff Hardin LLP

(57) ABSTRACT

A method for producing bipolar transistors with the aid of selective epitaxy for producing a collector and base. The method includes widening the area of the base either by the isotropic etching of the conductive layer or by the oxidation of the conductive layer and by the subsequent removal of the oxide layer. This widening of the area of the base prevents the occurrence of short-circuits between the emitter and the collector during the subsequent production of the base.

16 Claims, 6 Drawing Sheets

METHOD FOR FABRICATING A BIPOLAR TRANSISTOR

BACKGROUND OF THE INVENTION

The invention relates to a method for fabricating bipolar transistors, as can be used, for example, in radio frequency technology.

Bipolar transistors are the transistors of choice where high switching speeds and/or high output powers are required. Modern bipolar transistors can be operated at frequencies of 50 GHz and above. However, to further increase the switching speed, a number of difficulties still have to be eliminated. Parameters, which limit the frequency, are, in particular, the parasitic capacitance between the collector and the base and the base resistance. It has been possible to reduce both parameters to an ever increasing extent by miniaturization, which has been made possible by methods such as self-aligning of the base and the emitter, LOCOS process step sequences, trench techniques and refined layer techniques, such as selective epitaxy.

A further improvement is provided by bipolar transistors with hetero junctions. Bipolar transistors with hetero junctions are bipolar transistors in which the emitter and the base have different materials or different crystal structures, with different forbidden energy gaps. Suitable selection of the materials used for the base and the emitter allows the energy bands to be matched to one another in such a way that the emitter efficiency and the current amplification of the transistor are very high and the base can be designed to be highly doped and therefore have a good conductivity. A typical representative of this type of bipolar transistors is the Si/SiGe bipolar transistor.

Two embodiments of bipolar transistors of this type are disclosed in U.S. Pat. No. 5,962,879, and are explained below in conjunction with FIGS. 1 and 2.

FIG. 1 shows a cross section through an npn Si/SiGe bipolar transistor with a self-aligned collector-base junction. A buried $n^+$-layer 1-2 was produced by implantation in a p-doped silicon substrate 1-1. The insulating layer 1-3, the polysilicon layer 1-4 and a further insulating layer 1-5 are opened up above the buried $n^-$-layer, in order for a collector 1-6, a base 1-7 and an emitter 1-8 to be grown on there by selective epitaxy, preferably in one process step.

However, while the layers 1-6, 1-7 and 1-8 are being grown on in the region which has been opened up, thin polycrystalline or amorphous silicon layers 1-6-1, 1-7-1 and 1-8-1 are undesirably formed at the side wall of the polysilicon layer 1-4 and, as shown in FIG. 1, can also extend into the region of emitter and collector. These undesired layers may cause a short circuit between the emitter and the collector, to make the transistor unusable.

FIG. 2 shows a further bipolar transistor in accordance with the prior art, in which the above-described drawback of the short circuits being formed is avoided. This is achieved by the polysilicon layer which is responsible for the connection to the base being spatially separated from the base/collector region by a side wall insulation and by the base being produced not by selective deposition, but rather by deposition over the entire surface. Accordingly, no polycrystalline or amorphous silicon layers are formed in the region of the base, so that a short circuit between the emitter and the collector is prevented.

To produce the bipolar transistor shown in FIG. 2, a p-silicon substrate 2-1 with a buried $n^+$-layer 2-2 is provided. An oxide layer 2-3, a p-polysilicon layer 2-4 and a further intermediate oxide (not shown) are applied to the substrate and are opened up by means of a photolithographic process in the region of the active transistor region, all the way down to the oxide layer 2-3. The wall of the region which has been opened up is then covered by a first oxide spacer 2-6 and a second nitride spacer 2-7. Then, the oxide layer 2-3 is also opened up, and the intermediate oxide on the polysilicon layer 2-4 is etched until its thickness is the same as that of the oxide layer 2-3. A first selective epitaxy step then follows, by means of which a monocrystalline silicon layer, which forms the collector 2-8, is grown onto the silicon which has been opened up.

After the collector 2-8 has been produced, the intermediate oxide on the polysilicon layer 24 is etched away. The nitride spacer 2-7 is also etched at the top edge until it reaches the height of the top edge of the polysilicon layer 2-4. Then, the base is grown in monocrystalline form onto the collector, the base in this embodiment comprising the monocrystalline layers of silicon 2-9, undoped SiGe 2-10, p-doped SiGe 2-11 and silicon 2-12 again. However, the layers 2-10, 2-11 and 2-12 may also consist of p-doped silicon which is doped during the growth process. The growth of the base takes place over the entire surface and not selectively, i.e. the layers cover the collector and the polysilicon layer 2-4, by means of which contact is made with the base from the outside.

Then, a metal or silicide layer 2-13 is applied to the silicon layer 2-12, in order to reduce the line resistance to the base, and is patterned together with the base layers 2-9, 2-10, 2-11 and 2-12. This is followed by a further oxide layer 2-14 and the production of an opening with the spacers 2-15. The emitter 2-16 is produced in the opening, i.e. silicon which is doped in situ is grown selectively and in monocrystalline form onto the base. To finish the process, the polysilicon layer 2-17, which makes contact with the emitter, and a passivation layer 2-18 are also applied and the intermetallic connections 2-19 to the base and the collector and the emitter are produced.

However, a drawback of this method is that the collector, the base and the emitter have to be applied in separate epitaxy steps, which is highly complex in terms of process engineering and therefore very expensive. Furthermore, the production of the various spacers 2-6, 2-7 and 2-15 is also very complex.

SUMMARY OF THE INVENTION

Therefore, the present invention is based on the object of providing a method for fabricating a bipolar transistor, which does not have the difficulties which have been described above or only has them to a reduced extent and with which the number of process steps can be kept as low as possible or even be reduced.

This object is achieved by the method for fabricating a bipolar transistor.

The invention provides a method for fabricating a bipolar transistor which comprises the following steps:
a) providing a semiconductor substrate with a conductive region
b) successively applying at least one first insulating layer, at least one conductive layer and at least one second insulating layer to the semiconductor substrate;
c) applying a mask;
d) carrying out a substantially anisotropic etch of the second insulating layer, a substantially isotropic etch of the conductive layer and a substantially anisotropic etch of the first insulating layer, so that an opening to the conductive region is produced;

e) producing a collector and a base, which is connected to the conductive layer, by selective epitaxy in the opening; and f) producing an emitter.

Furthermore, the invention provides a method for fabricating a bipolar transistor which comprises the following steps:

a) providing a semiconductor substrate with a conductive region;

b) successively applying at least one first insulating layer, at least one conductive layer and at least one second insulating layer to the semiconductor substrate;

c) applying a mask;

d) substantially anisotropically etching the second insulating layer and the conductive layer;

e) thermal oxidizing the side wall of the conductive layer, so that an oxide layer is produced at the side wall of the conductive layer;

f) substantially anisotropically etching the first insulating layer, so that an opening to the conductive region is produced;

g) producing a collector by selective epitaxy in the opening;

h) etching away the oxide layer on the side wall of the conductive layer;

i) producing a base, which is connected to the conductive layer, by selective epitaxy in the opening; and j) producing an emitter.

Furthermore, the invention provides a method for fabricating a bipolar transistor which comprises the following steps:

a) providing a semiconductor substrate with a conductive region;

b) successively applying at least one first insulating layer, at least one conductive layer and at least one second insulating layer to the semiconductor substrate;

c) applying a mask;

d) anisotropically etching the second insulating layer and the conductive layer is carried out;

e) thermal oxidizing the side wall of the conductive layer, so that an oxide layer is produced at the side wall of the conductive layer;

f) anisotropically etching the first insulating layer, so that an opening to the conductive region is produced;

g) etching away the oxide layer on the side wall of the conductive layer;

h) producing a collector and a base, which is connected to the conductive layer, by selective epitaxy in the opening; and i) producing an emitter.

The methods according to the invention can be used for the fabrication of both npn transistors and pnp transistors. The methods according to the invention have the advantage that, on account of the isotropic etching of the conductive layer and/or the oxidation of the conductive layer followed by removal of the oxide layer, the base region is widened, so that during the subsequent production of the base there can be no short circuits between the emitter and the collector. In this respect, the methods according to the invention have the same advantage as the method which has been described in connection with FIG. 2. However, in the methods according to the invention this advantage is achieved with the aid of a significantly simpler and therefore less expensive method sequence.

The conductive region is preferably an implanted layer, which is also known as a buried layer. The conductive region is used to produce a connection between the collector and the laterally offset collector contact hole which has a resistance which is as low as possible.

The first insulating layer, the conductive layer and the second insulating layer serve as a mask material which is to be patterned for positioning of the transistor on the semiconductor substrate. In addition, the conductive layer has the function of making contact with the base of the bipolar transistor which is to be applied with respect to the outside. The second insulating layer is preferably a silicon oxide, the conductive layer is preferably a doped polysilicon, and the first insulating layer is preferably a layer which preferably comprises two part-layers. The first part-layer, which is applied to the semiconductor substrate, is preferably an oxide layer, while the second part-layer, which is applied to the first part-layer, is preferably a nitride layer.

The second part-layer serves, inter alia, as an etching stop for the anisotropic etch which is used to open up the second insulating layer and the conductive layer. The first part-layer is preferably an insulating material with a low dielectric constant, in order to have a low parasitic capacitance between the semiconductor substrate (including the buried layer) and the conductive layer. Silicon oxide is the preferred material for the first part-layer.

The second insulating layer, the conductive layer and the first insulating layer are opened up by photolithographic means with the aid of the mask in such a way that an opening to the conductive region is produced. The first and second insulating layers are opened up using a predominantly anisotropic etching process, while the conductive layer is treated by means of an isotropic etch.

It is preferable for an additional anisotropic etch of the conductive layer to be carried out before the isotropic etch of the conductive layer. The isotropic etch of the conductive layer causes the conductive layer to be removed over a predetermined extent in the region between the first and the second insulating layers. The extent of this etch is preferably at least as wide as the thickness of the collector layer which is yet to be applied. The isotropic etch therefore ensures that the silicon and the doping material which accumulates there as a result of the selective epitaxy step for production of the collector does not extend into the active region of the base. For example, if the conductive layer is a polysilicon layer, the silicon together with the doping material is deposited in polycrystalline form at the side wall of the polysilicon layer. If this material were to extend into the active base region, leakage-current regions or even a short circuit between base and collector, as in the case of FIG. 1, would form there.

In a preferred embodiment, the side wall of the conductive layer is then oxidized or provided with an oxide layer. This oxidation prevents the silicon which is available during the epitaxial growth of the collector, together with the doping material of the silicon, from being deposited at the wall surface of the polysilicon layer. The oxidation is subsequently removed again together with the materials which have grown on.

Selective epitaxy is first used to produce the collector and then the base in the opening. The thickness of the collector layer is to be selected in such a way that the layer does not extend into the region of the conductive layer. The layer thickness of the base is to be selected in such a way that the side wall of the base covers the side wall of the conductive layer.

If the side wall of the conductive layer has not been oxidized or coated with oxide, the collector and the base layers are preferably fabricated in one process step, the doping profile of the collector and the base preferably being set during the growth, in situ. This method allows the fabrication of complex doping profiles which in this way can be optimized and set for various applications and specifications without problems. Furthermore, this method reduces the number of process steps and therefore the likelihood of faults, and also reduces costs.

On the other hand, if the side wall of the insulating layer has been oxidized or covered with an insulating layer, this oxide layer needs to be etched down after the production of the collector and before the production of the base. In this case, the collector and the base are not produced in a single process step. In this case, although the doping profile of the collector and the base is still preferably set in situ, this takes place in two separate process steps. The advantage of this method is that, during the epitaxy step for production of the collector, no silicon is deposited on the oxide surface of the side wall of the conductive layer, so that, after the oxide layer has been eliminated, the base which is to be applied in the subsequent step comes into contact with the original material of the conductive layer. Accordingly, this leads to a particularly low resistance between the conductive layer and the: active base region.

The emitter is produced using the method according to the prior art. The emitter is preferably produced by means of an $n^+$-polysilicon layer, which is then patterned.

The first insulating layer, the conductive layer and the second insulating layer are opened up by anisotropic etching above the conductive region in modified methods according to the invention. The conductive layer is not treated by an additional isotropic etching step. Instead, the side wall of the conductive layer is oxidized, and the oxide layer penetrates into the conductive layer between the two insulating layers to a predetermined extent.

The oxidation of the conductive layer brings with it a number of advantages. The oxide layer produces a widened opening in the conductive layer as a result of the oxide firstly growing into the conductive layer and then being eliminated. During production of the base by means of selective epitaxy, the widened opening in the conductive layer serves to accommodate the silicon and its doping which is deposited during this process, so that it cannot reach the active region of the base. Furthermore, as a result of oxidation and subsequent removal of the oxide layer, the opening in the conductive layer can often be set more accurately and reproducibly than is possible by simply etching the conductive layer.

If the oxide layer is only removed again after the collector has been produced, the oxide layer protects the conductive layer from deposits during the production of the collector. If the oxide layer is removed again before the collector is produced, the collector and the base can be produced by means of common selective epitaxy. In this case, the oxide layer may already have been removed before the first insulating layer is opened up.

The method is preferably applied to a semiconductor substrate which does not have an epitaxial layer. This saves costs and time, since the application of epitaxial layers is complex. Since, in the method according to the invention, the collector is embedded epitaxially in the insulating layers, the buried layer and the base are spatially separated from one another by at least the thickness of the first insulating layer.

The fact that the collector is embedded in the insulating layer further reduces the fringing capacitances between the base and the collector. Suitable selection of the material with a low dielectric constant allows the fringing capacitance to be reduced further. The first insulating layer preferably comprises a silicon oxide and a silicon nitride layer resting thereon.

A heat treatment step is preferably carried out after the base has been applied, as a result of which the doping material of the conductive layer, which is preferably highly doped polysilicon, diffuses into the lateral region of the base. The lateral region of the base is the region of the base which is not active, i.e. does not have a simultaneous layer junction with the collector and the emitter. It therefore acts as an electrical connection between the active base and the polysilicon.

The lateral diffusion of doping material from the polysilicon into the lateral region of the base helps to reduce the electrical resistance between the conductive layer and the active base and therefore to make the bipolar transistor faster. The diffusion profile can be set by means of the duration and the temperature of the heat treatment step. The duration and the temperature of the heat treatment step are preferably set in such a way that the diffusion extends as far as the active region of the base, and, in this way, the lowest possible resistance between the conductive layer and the active base region is produced. By using a higher temperature and/or longer duration for the heat treatment step, it is also possible to adjust the doping profile of the active base zone in this way.

The emitter is produced by methods which are known from the prior art. The emitter is preferably produced by depositing a polysilicon layer on the base or by means of further epitaxy.

In the preferred embodiments of the invention, the base includes materials other than silicon. Preferred materials for bipolar transistors are those in which the base has a narrower "forbidden gap" than the emitter material. With bipolar transistors of this type it is possible, inter alia, to increase the current amplification, to reduce the base resistance and to increase the operating temperature range. An embodiment in which the emitter is silicon and the base is SiGe is preferred. The base may preferably also comprise a plurality of layers of different materials, for example an Si-SiGe(1)-SiGe(2)-Si sequence, where SiGe(x) denotes differently doped layers.

Additional advantages and features of the invention will be apparent from the following description of the preferred embodiments, the drawings and claims.

DESCRIPTION OF THE PREFERRED EMBODIMENTS

The principles of the present invention are useful when incorporated in a preferred embodiment of the inventive method for fabricating an npn bipolar transistor, as shown by FIG. 3A to FIG. 3E.

Figure 1:
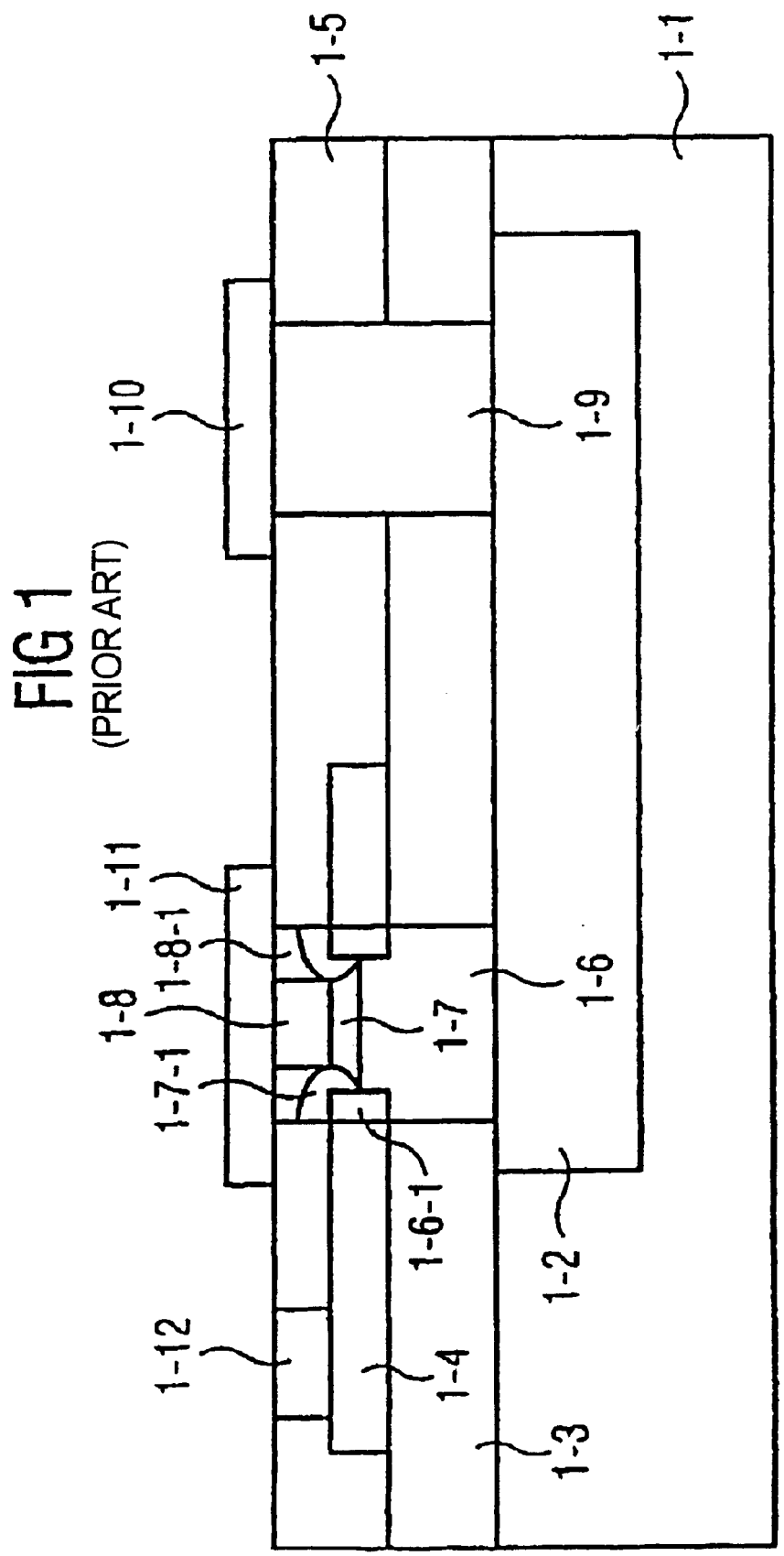
FIG. 1 shows a first embodiment of a bipolar transistor according to the prior art.
Figure 2:
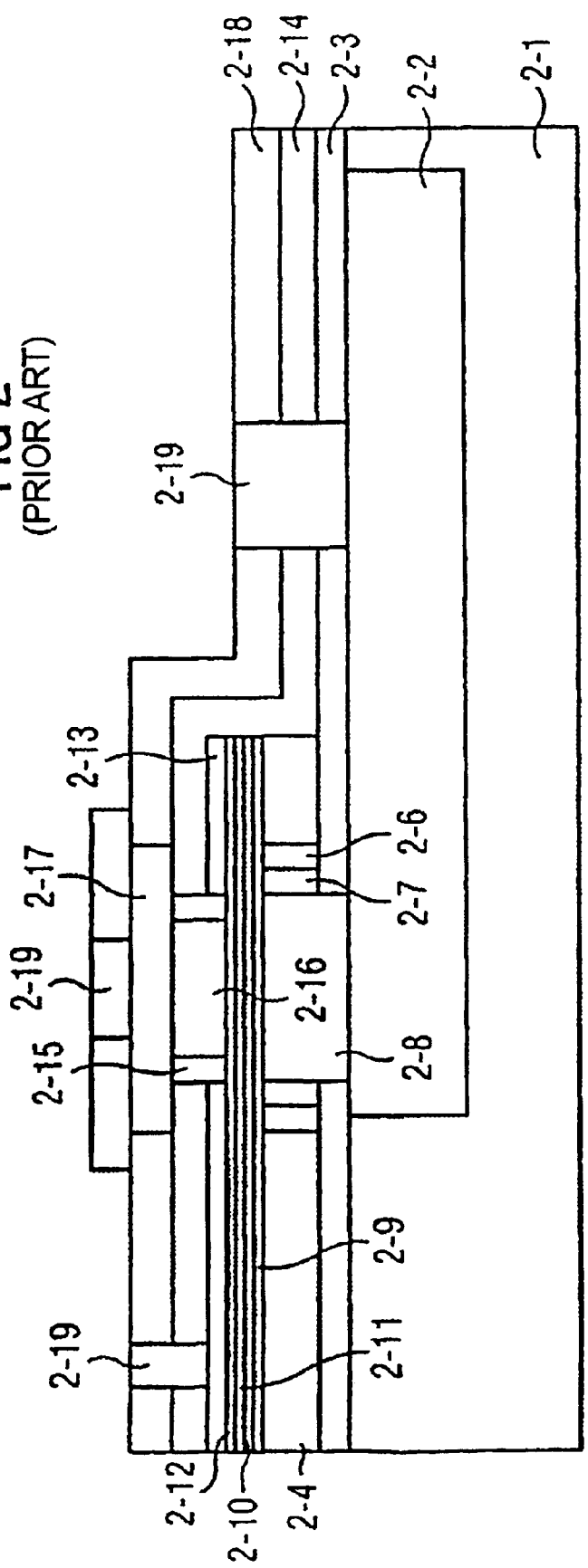
FIG. 2 shows a second embodiment of a bipolar transistor according to the prior art.
Figure 3A:
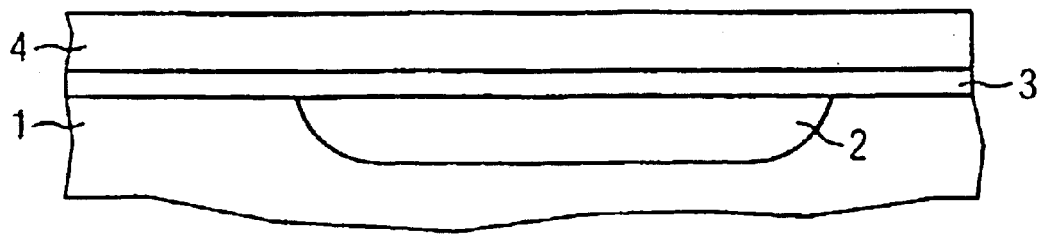
FIGS. 3A-3E show the steps of a first inventive method for fabricating a bipolar transistor.

FIG. 3A shows a semiconductor substrate 1 made from p-doped silicon with a buried layer 2 which is implanted with n-doped material, and with a thermal oxide layer 3 and a nitride layer 4 resting thereon. Thermal oxide layer 3 and nitride layer 4 together represent a first insulating layer. The thickness of the oxide layer 3 and of the nitride layer 4 together is selected in such a way as to be greater than or equal to the thickness of the collector layer which is yet to be produced.

Figure 3B:
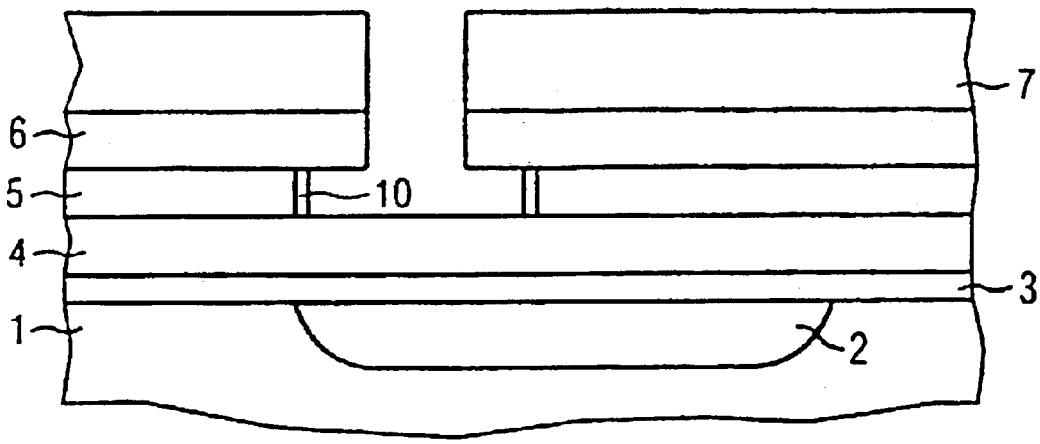

Next, a polysilicon layer 5 is deposited on the nitride layer and implanted with p-doping material, so that a conductive layer is formed. Then, an oxide layer 6, which corresponds to the second insulating layer, is deposited on the polysilicon layer 5. The resulting situation is shown in FIG. 3B.

This is followed by the substantially anisotropic etching of the oxide layer 6 and of the polysilicon layer 5 through the mask 7. The mask opening is located above the buried layer 2. This is followed by the isotropic etching of the conductive layer 5, which etches away the polysilicon 5 between the two insulating layers to a predetermined extent. This extent is preferably approximately the same as the thickness of the collector layer which is yet to be applied. The extent defines the lateral base region 13a, in which the junction from the implanted polysilicon to the monocrystalline active base region 13b is preferably situated. For a low base resistance, it is important for the lateral base region also to be designed with as low a resistance as possible.

The side wall of the polysilicon layer 5 which has been etched away can optionally then be oxidized or covered with an oxide layer 10, so that an oxide layer is applied to the polysilicon wall.

Then, the nitride layer 4 is etched substantially isotropically, and the thermal oxide layer 3 below it is then opened up by wet-chemical means. Then, in one process step, collector 12 and base 13 are grown onto the buried layer 2 by selective epitaxy. The doping profile is set in situ during the processing, and this process step allows a considerable variation in the doping profiles. The collector is preferably an n-doped silicon, while the base is preferably p-doped SiGe. During the application of the collector and the emitter layers, it should be ensured that the layer of the base completely covers the side wall of the polysilicon layer 5.

Figure 3C:
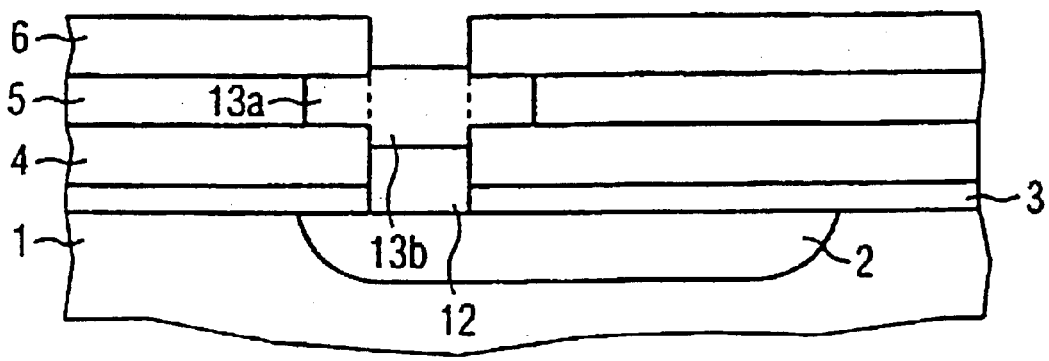

If the polysilicon wall is provided with an oxide layer 10, the collector and the base cannot be produced in a single process step. In this case, the collector 12 is grown on first by means of a selective epitaxy process, and then the oxide layer 10 is etched, and only then is the base 13 grown on. The oxide layer 10 prevents silicon from being able to accumulate on the polysilicon during production of the collector 12. After application of collector 12 and base 13, a spacer 15 (FIG. 3D) may optionally be applied to the base. The resulting situation is shown in FIG. 3C.

Figure 3D:
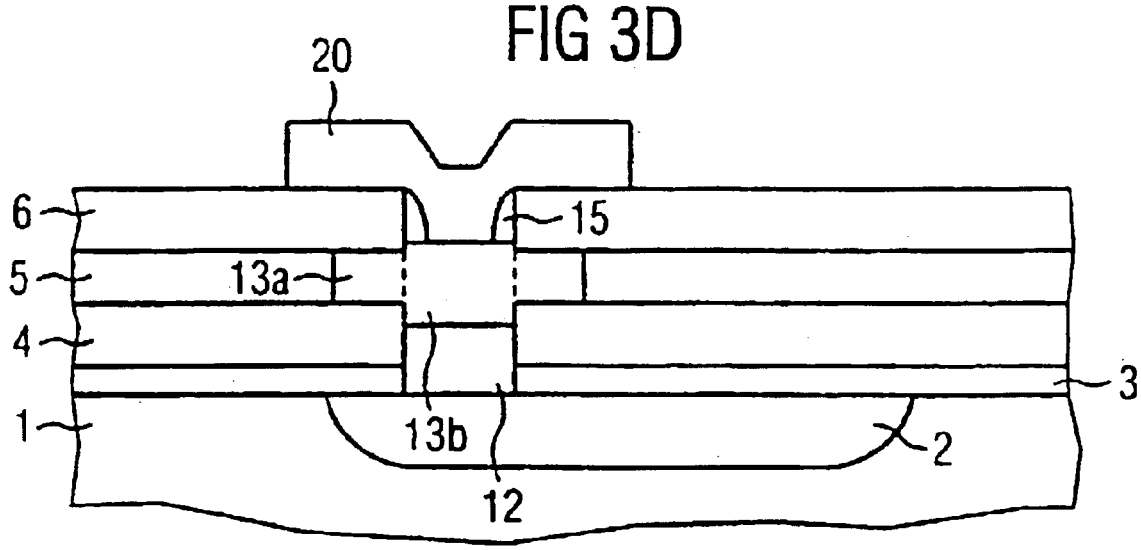
Figure 3E:
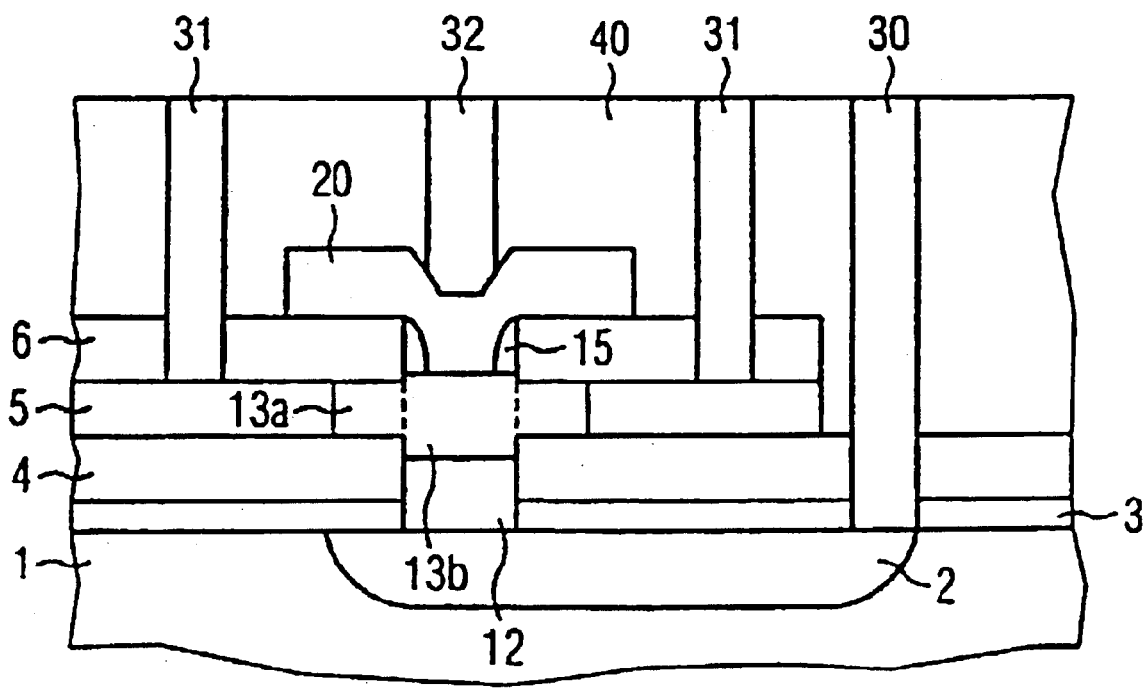

Then, the polysilicon for the emitter 20 is applied and patterned in such a way that it covers the active base region 13b (FIG. 3D). Instead of polysilicon deposition, it is also possible for further selective epitaxy to be carried out in order to produce the emitter. This is followed by further process steps in accordance with the prior art, which include applying an insulating or passivation layer 40 and prior art steps are used to produce a contact hole 30 to the buried layer 2 for a connection of the collector 12, contact holes 31 to the polysilicon layer 5 for the connection of the base 13 and a contact hole 32 on the layer 40 to the polysilicon 20 for the connection of the emitter. The resulting situation is shown in FIG. 3E.

Figure 4A:
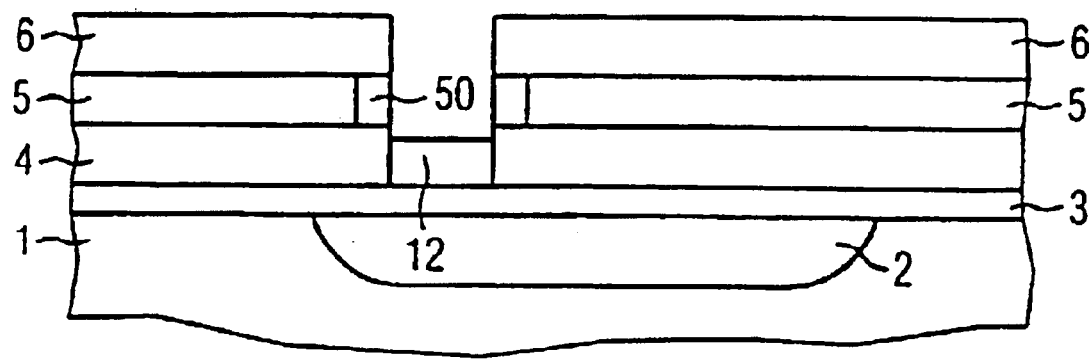
FIGS. 4A-4B show the steps of a second inventive method for fabricating a bipolar transistor.
Figure 4B:
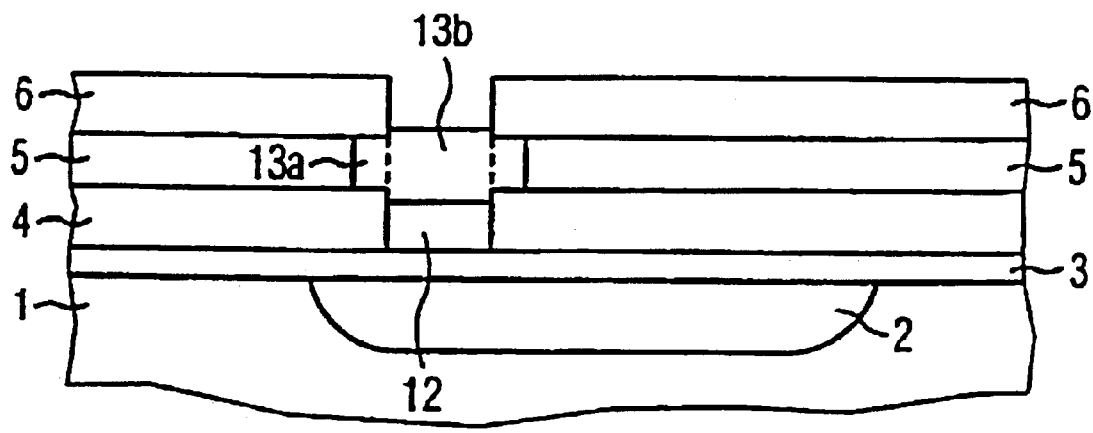

FIGS. 4A and 4B show two steps of a second method according to the invention, which differ from the method illustrated in FIGS. 3A to 3E. The first steps of the second inventive method are illustrated in FIG. 3A. Then, a thermal oxide layer or an oxide deposition 3, a nitride layer 4, a polysilicon layer 5 (together with p-implantation) and an oxide layer 6 are applied to the substrate as in the previous embodiment. This is followed by the production of the mask 7, then the anisotropic etching of oxide layer 6 and polysilicon layer 5, which is patterned in the same way as in the previous embodiment. Unlike in the previous embodiment, oxidation 50 (FIG. 4A) then takes place at the side wall of the polysilicon layer 5, this oxidation to some extent eating into the polysilicon. The oxide layer 50 protects the p-doped polysilicon from the material which would be deposited there during the subsequent selective epitaxy for production of the collector 12.

Then, the collector 12 is produced from a monocrystalline silicon with n-doping material by means of selective epitaxy. This is followed by removal of the oxide layer 50, so that the p-doped polysilicon layer 5 at the side wall is uncovered again. At the same time, in this way space is created for the lateral base region 13a, in which the junction from the p-doped polysilicon to the monocrystalline silicon may be situated in the region of the active base 13b.

Next, the base, which is composed of the lateral base region 13a and the active base region 13b (FIG. 4B), is produced by means of selective epitaxy. The thickness of the base layer is preferably thicker than the thickness of the polysilicon layer, specifically in such a way that it completely covers the polysilicon layer 5. The following steps for producing the npn bipolar transistor are then the same as those illustrated in FIGS. 3D and 3E.

Figure 5A:
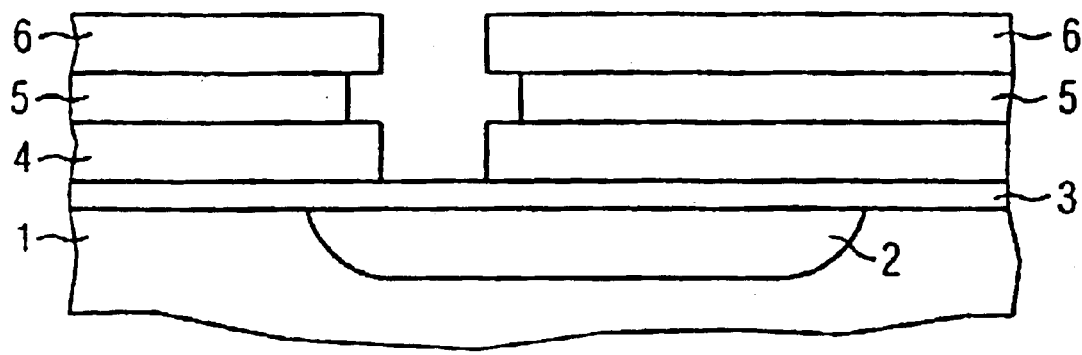
FIGS. 5A-5B show the steps of a third inventive method for fabricating a bipolar transistor.
Figure 5B:
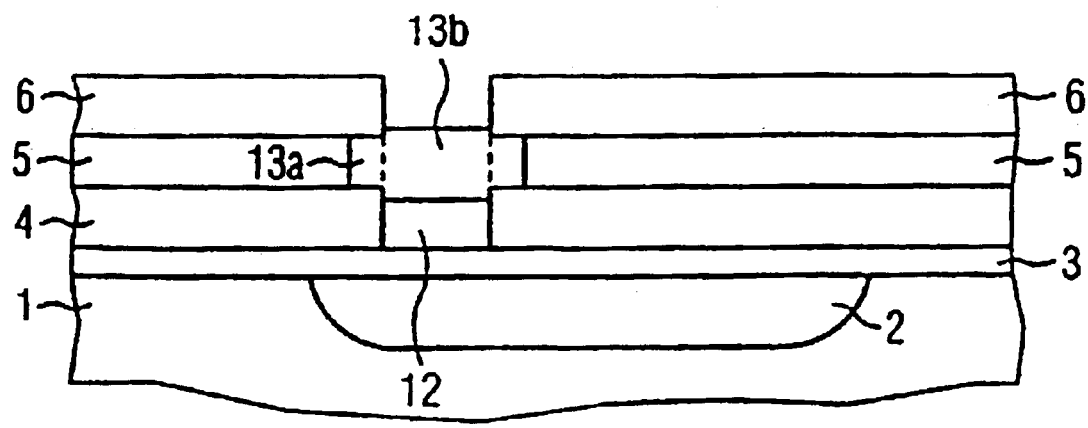

FIGS. 5A and 5B show two steps of a further inventive method, which likewise deviate from the method illustrated in FIGS. 3A to 3E. The first steps of this further inventive method are illustrated in FIG. 3A. Then, a thermal oxide layer or an oxide deposition 3, a nitride layer 4, a polysilicon layer 5 (together with p-implantation) and an oxide layer 6 are applied to the substrate as in the previous embodiment. This is followed by the production of the mask 7, then the anisotropic etching of oxide layer 6 and polysilicon layer 5, which is patterned as in the previous embodiment. Then, as in the second embodiment of the present invention, oxidation takes place at the side wall of the polysilicon layer 5, this oxidation to some extent eating into the polysilicon.

Then, the oxide layer of the side wall of the polysilicon layer 5 is removed selectively with respect to the polysilicon of the conductive layer 5 before the production of the collector or before the etching of the nitride layer 4. Next, the nitride layer 4 and the oxide layer 3 are opened up, resulting in the situation shown in FIG. 5A.

Since in this way the oxide layer has already been removed at the side wall of the polysilicon layer 5, it is now possible for collector 12 and base 13 to be produced epitaxially in one step in accordance with the first embodiment of the present invention. The resulting situation is shown in FIG. 5B. The following steps for production of the npn bi-polar transistor are then once again as described in connection with FIGS. 3D and 3E.

We claim:

1. A method for fabricating a bipolar transistor, comprising the steps of:

providing a semiconductor substrate with a conductive region;

successively applying at least one first insulating layer, at least one conductive layer and at least one second insulating layer to the semiconductor substrate;

applying a mask;

carrying out a substantially anisotropic etching of the second insulating layer, a substantially isotropic etching of the conductive layer and a substantially anisotropic etching of the first insulating layer, so that an opening to the conductive region is produced;

producing a collector and a base, which is connected to the conductive layer, by selective epitaxy in the opening, which is carried out in one process step; and producing an emitter.

2. A method according to claim 1, wherein, before the isotropic etching of the conductive layer, opening up the conductive layer by an anisotropic etching to form an anisotropic opening.

3. A method according to claim 2, wherein the isotropic etching produces an opening to the conductive layer which, compared to the anisotropic opening, has a diameter which is increased by an extent, which is approximately the thickness of the subsequently provided collector.

4. A method according to claim 1, which includes setting doping of the collector and the base during the epitaxy steps.

5. A method according to claim 1, wherein the first insulating layer has a first insulating sublayer, which is applied to the semiconductor substrate, and a second insulating sublayer, which is applied to the first insulating sublayer.

6. A method according to claim 5, wherein the first insulating sublayer is silicon oxide.

7. A method according to claim 5, wherein the second insulating sublayer is silicon nitride.

8. A method according to claim 1, wherein the second insulating layer is silicon oxide.

9. A method according to claim 1, wherein the conductive layer is doped polysilicon.

10. A method according to claim 1, which includes reducing the electrical resistance from the conductive layer to an active region of the base by a heat treatment step.

11. A method according to claim 1, wherein the emitter is produced by polysilicon deposition.

12. A method according to claim 1, wherein the emitter is produced by epitaxial deposition.

13. A method according to claim 1, wherein the base includes at least one layer of silicon-germanium.

14. A method according to claim 1, wherein the semiconductor substrate does not have an epitaxial layer.

15. A method for fabricating a bipolar transistor, comprising the steps of:

providing a semiconductor substrate with a conductive region;

successively applying at least one first insulating layer, at least one conductive layer and at least one second insulating layer to the semiconductor substrate;

applying a mask;

anisotropically etching the second insulating layer and the conductive layer;

thermally oxidizing the side walls of the conductive layer, so that an oxide layer is produced at the side wall of the conductive layer;

anisotropically etching the first insulating layer, so that an opening to the conductive region is produced;

producing a collector by selective epitaxy in the opening;

etching away the oxide layer on the side wall of the conductive layer;

producing a base, which is connected to the conductive layer, by selective epitaxy in the opening; and producing an emitter.

16. A method for fabricating a bipolar transistor, comprising the steps of:

providing a semiconductor substrate with a conductive region;

successively applying at least one first insulating layer, at least one conductive layer and at least one second insulating layer to the semiconductor substrate;

applying a mask;

anisotropically etching the second insulating layer and the conductive layer;

thermally oxidizing the side wall of the conductive layer, so that an oxide layer is produced at the side wall of the conductive layer;

anisotropically etching the first insulating layer, so that an opening to the conductive region is produced;

etching away the oxide layer on the side wall of the conductive layer;

producing a collector and a base, which is connected to the conductive layer, by selective epitaxy in the opening; and producing an emitter.

* * * * *